United States Patent
Yu et al.

(10) Patent No.: US 10,340,198 B2
(45) Date of Patent: Jul. 2, 2019

(54) SEMICONDUCTOR PACKAGE WITH EMBEDDED SUPPORTER AND METHOD FOR FABRICATING THE SAME

(71) Applicant: MEDIATEK INC., Hsin-Chu (TW)

(72) Inventors: Ta-Jen Yu, Taichung (TW); Wen-Sung Hsu, Zhubei (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/881,030

(22) Filed: Jan. 26, 2018

(65) Prior Publication Data

US 2018/0233425 A1 Aug. 16, 2018

Related U.S. Application Data

(60) Provisional application No. 62/458,044, filed on Feb. 13, 2017.

(51) Int. Cl.
*H01L 23/52* (2006.01)
*H01L 23/31* (2006.01)
(Continued)

(52) U.S. Cl.
CPC ........ *H01L 23/3114* (2013.01); *H01L 21/561* (2013.01); *H01L 21/565* (2013.01); *H01L 21/568* (2013.01); *H01L 21/6835* (2013.01); *H01L 23/562* (2013.01); *H01L 24/02* (2013.01); *H01L 24/11* (2013.01); *H01L 24/13* (2013.01); *H01L 24/20* (2013.01); *H01L 24/96* (2013.01); *H01L 24/97* (2013.01); *H01L 24/19* (2013.01); *H01L 2224/0231* (2013.01); *H01L 2224/02372* (2013.01); *H01L 2224/02379* (2013.01); *H01L 2224/02381* (2013.01); *H01L 2224/04105* (2013.01); *H01L 2224/12105* (2013.01);
(Continued)

(58) Field of Classification Search
CPC ........ H01L 24/13; H01L 24/97; H01L 24/11; H01L 24/02; H01L 24/20; H01L 24/96; H01L 21/561; H01L 21/565; H01L 21/6835; H01L 21/568; H01L 23/562
USPC ........................................... 257/774
See application file for complete search history.

(56) References Cited

U.S. PATENT DOCUMENTS 7,944,039 B2 * 5/2011 Arai ............... H01L 21/568
257/690
8,791,562 B2 * 7/2014 Lee ............... H01L 25/0655
257/612

(Continued)

FOREIGN PATENT DOCUMENTS

CN 104733402 A 6/2015
CN 107527880 A 12/2017

*Primary Examiner* — Luan C Thai
(74) *Attorney, Agent, or Firm* — McClure, Qualey & Rodack, LLP

(57) ABSTRACT

The invention provides a semiconductor package and a method for fabricating the same. The semiconductor package includes a redistribution layer (RDL) structure, a semiconductor die, a molding compound and a supporter. The RDL structure has a first surface and a second surface opposite to the first surface. The semiconductor die is disposed on the first surface of the RDL structure and electrically coupled to the RDL structure. The molding compound is positioned overlying the semiconductor die and the first surface of the RDL structure. The supporter is positioned beside the semiconductor die and in contact with the first surface of the RDL structure.

25 Claims, 8 Drawing Sheets

(51) Int. Cl.
*H01L 21/56* (2006.01)
*H01L 23/00* (2006.01)
*H01L 21/683* (2006.01)

(52) U.S. Cl.
CPC ............ *H01L 2224/13024* (2013.01); *H01L 2924/1421* (2013.01); *H01L 2924/1431* (2013.01); *H01L 2924/1432* (2013.01); *H01L 2924/1434* (2013.01); *H01L 2924/1436* (2013.01); *H01L 2924/1438* (2013.01); *H01L 2924/18162* (2013.01); *H01L 2924/3511* (2013.01); *H01L 2924/3512* (2013.01); *H01L 2924/35121* (2013.01)

(56) References Cited

U.S. PATENT DOCUMENTS

| | | | |
|---|---|---|---|
| 9,385,102 B2 * | 7/2016 | Lin | .................... H01L 21/4853 |
| 9,806,063 B2 * | 10/2017 | Kim | ........................ H01L 23/16 |
| 9,831,195 B1 | 11/2017 | Lu | |
| 2011/0037155 A1 | 2/2011 | Pagaila | |
| 2014/0091454 A1 | 4/2014 | Lin et al. | |
| 2016/0307847 A1 | 10/2016 | Lee et al. | |
| 2016/0322332 A1 | 11/2016 | Kim et al. | |
| 2017/0271272 A1 | 9/2017 | Lee et al. | |

\* cited by examiner

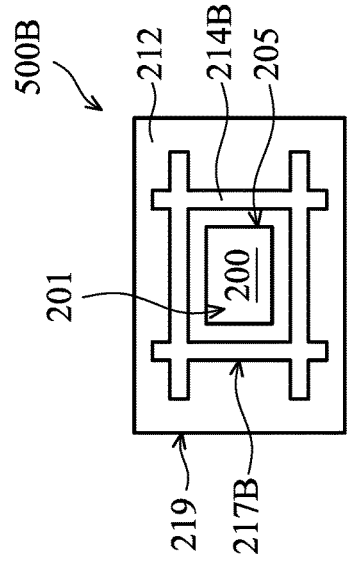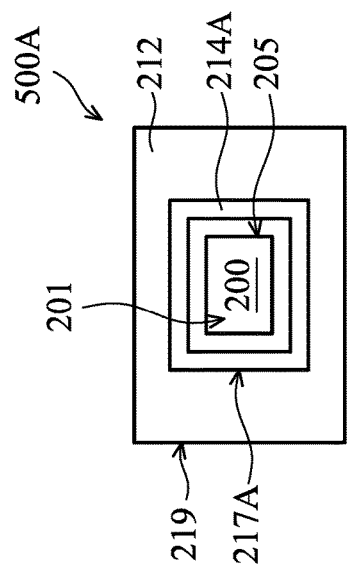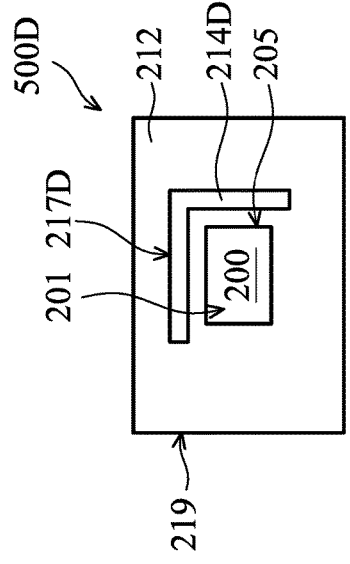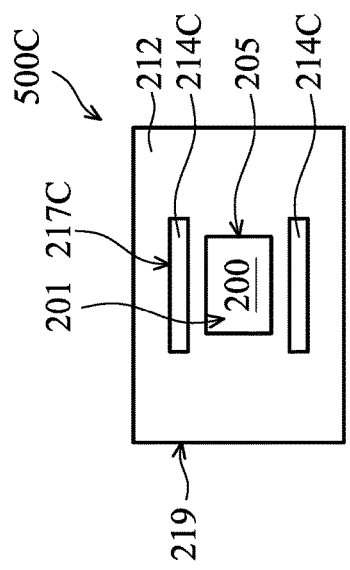

SEMICONDUCTOR PACKAGE WITH EMBEDDED SUPPORTER AND METHOD FOR FABRICATING THE SAME

CROSS REFERENCE TO RELATED APPLICATIONS

This application claims the benefit of U.S. Provisional Application No. 62/458,044 filed on Feb. 13, 2017, the entirety of which is incorporated by reference herein.

BACKGROUND OF THE INVENTION

Field of the Invention

The present invention relates to a semiconductor package and a method for fabricating the same, and in particular to a fan-out wafer-level semiconductor package (FOWLP) with an embedded supporter and a method for fabricating the same.

Description of the Related Art

In order to ensure the continued miniaturization and multi-functionality of electric products and communication devices, it is desired that semiconductor packages be small in size, support multi-pin connection, operate at high speeds, and have high functionality. The impact of this will be pressure on semiconductor package fabricators to develop fan-out semiconductor packages. However, the fabrication process of the fan-out semiconductor package may induce problems such as package warpage, defocusing of the photolithography process of the redistribution layer (RDL) structure, etc. The aforementioned problems may affect the reliability and quality of products.

Thus, a novel semiconductor package is desirable.

BRIEF SUMMARY OF THE INVENTION

Exemplary embodiments of a semiconductor package and a method for fabricating the same are provided. An exemplary embodiment of a semiconductor package includes a redistribution layer (RDL) structure, a semiconductor die, a molding compound and a supporter. The RDL structure has a first surface and a second surface opposite to the first surface. The semiconductor die is disposed on the first surface of the RDL structure and electrically coupled to the RDL structure. The molding compound is positioned overlying the semiconductor die and the first surface of the RDL structure. The supporter is positioned beside the semiconductor die and in contact with the first surface of the RDL structure.

Another exemplary embodiment of a semiconductor package includes a redistribution layer (RDL) structure, a semiconductor die, a molding compound and a supporter. The RDL has a first surface and a second surface opposite to the first surface. The semiconductor die is disposed on the first surface of the RDL structure and electrically coupled to the RDL structure. The molding compound is positioned overlying the semiconductor die and the first surface of the RDL structure. The supporter extends along a boundary of the semiconductor die, wherein the supporter is electrically isolated from the semiconductor die and the RDL structure.

An exemplary embodiment of a method for fabricating a semiconductor package includes disposing a semiconductor die on a carrier. The method includes disposing a supporter on the carrier and beside the semiconductor die. The method further includes applying a molding compound to the carrier, wherein the molding compound covers the semiconductor die and the supporter. The method further includes forming a redistribution layer (RDL) structure on the molding compound and coupled to the semiconductor die. The method further includes forming conductive structures on the RDL structure.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIGS. 8A-8D are plan views showing shapes of supporters arranged along a boundary of the semiconductor die of a semiconductor package in accordance with some embodiments of the disclosure.

DETAILED DESCRIPTION OF THE INVENTION

Figure 1:
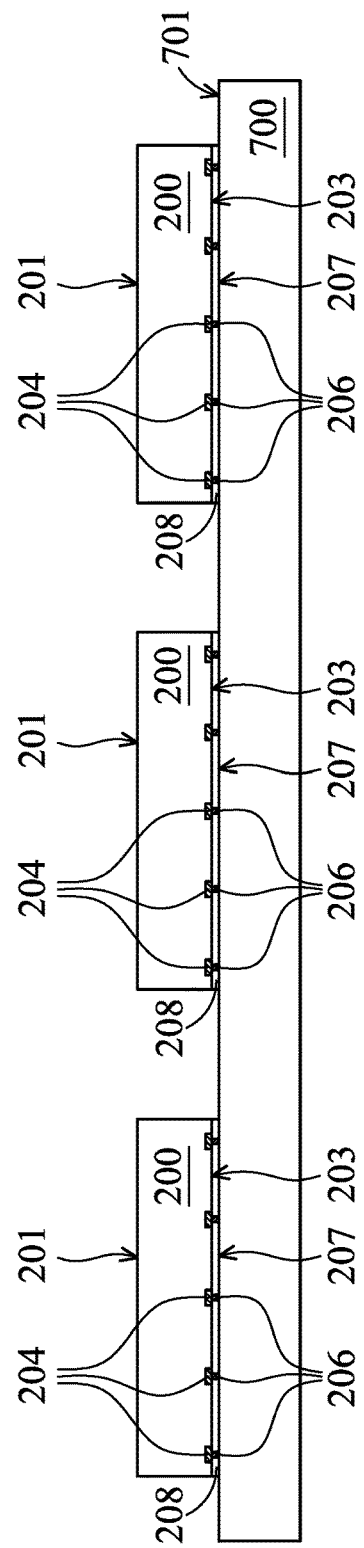
FIGS. 1-7 are cross-sectional view of a method for fabricating a semiconductor package in accordance with some embodiments of the disclosure.

The following description is of the best-contemplated mode of carrying out the invention. This description is made for the purpose of illustrating the general principles of the invention and should not be taken in a limiting sense. The scope of the invention is determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

FIGS. 1-7 are cross-sectional view of a method for fabricating a semiconductor package 500 in accordance with some embodiments of the disclosure. In some embodiments, the semiconductor package 500 is a fan-out wafer-level semiconductor package (FOWLP). For example, the semiconductor package 500 may include a pure system-on-chip (SOC) package or a hybrid system-on-chip (SOC) package (including a dynamic random access memory (DRAM), a power management integrated circuit (PMIC), a flash memory, a global positioning system (GPS) device or a radio frequency (RF) device). The semiconductor package 500 may be mounted on the base (not shown), for example a printed circuit board (PCB) formed of polypropylene (PP), by a bonding process. In some embodiments, the semiconductor package 500 includes a semiconductor die, a supporter, a molding compound, a redistribution layer (RDL) structure and a plurality of conductive structures.

As shown in FIG. 1 a carrier 700 is provided. The carrier 700 may be configured to provide structural rigidity or a base for deposition of subsequent non-rigid layers. Next, a plurality of semiconductor dies 200 separated from each other is disposed attached to a die-attach surface 701 of the carrier 700 through an adhesive layer (not shown). In some embodiments, the carrier 700 is formed of silicon or glass.

In some embodiment as shown in FIG. 1, each of the semiconductor dies 200 has a back-side surface 201 and a front-side surface 203 opposite to the back-side surface 201. The front-side surface 203 of each of the semiconductor dies 200 may face the die-attach surface 701 of the carrier 700. The back-side surface 201 of each of the semiconductor dies 200 may face away from the carrier 700. In some embodiments, the semiconductor dies 200 are system-on-chip (SOC) dies or memory dies. For example, the system on chip (SOC) die may include a logic die including a central processing unit (CPU), a graphic processing unit (GPU), a dynamic random access memory (DRAM) controller or any combination thereof. For example, the memory dies may include a dynamic random access memory (DRAM) dies. In addition, the semiconductor die 200 may be fabricated by a flip-chip technology.

In some embodiments, each of the semiconductor dies 200 includes die pads 204, at least one dielectric layer 208 and corresponding conductive vias 206. In some embodiments, the die pads 204 are formed close to the front-side surface 203. In addition, the die pads 204 are electrically connected to the circuitry (not shown) of the corresponding semiconductor die 200. In some embodiments, the die pads 204 belong to the uppermost metal layer of the interconnection structure (not shown) of the semiconductor die 200. In some embodiments, the dielectric layer 208 is formed covering the front-side surface 203 of the corresponding semiconductor die 200 and portions of the die pads 204. A top surface 207 of the dielectric layer 208 may be in contact with the die-attach surface 701 of the carrier 700. The conductive vias 206, which are positioned corresponding to the die pads 204, is disposed on the front-side surface 203 of each of the semiconductor dies 200. The conductive vias 206 pass through the dielectric layer 208. The conductive vias 206 are in contact with and electrically coupled to the die pads 204 of the semiconductor die 200.

Figure 2:
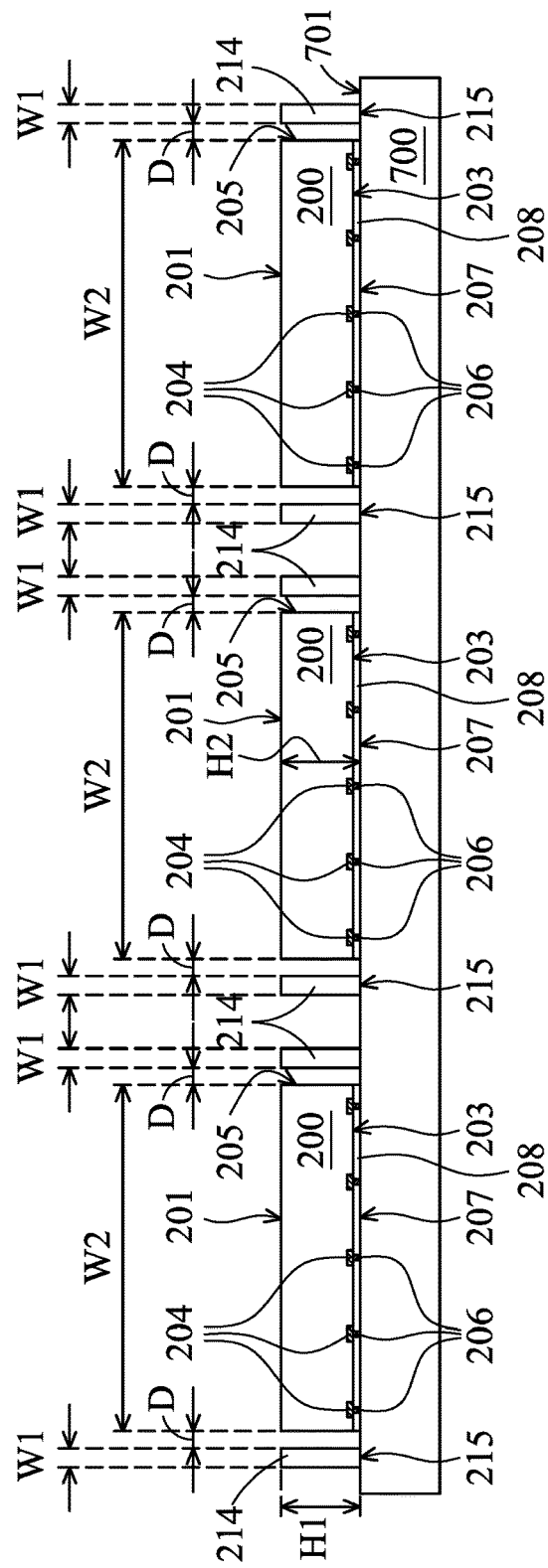

Next, a plurality of supporters 214 is disposed on the carrier 700, as shown in FIG. 2 in accordance with some embodiments. In some embodiments, each of the supporters 214 is positioned beside the corresponding semiconductor die 200. A surface 215 of the supporter 214 may be in contact with the die-attach surface 701 of the carrier 700. Each of the supporter 214 may be positioned surrounded the corresponding semiconductor die 200. The supporter 214 may be separated from a boundary 205 of the corresponding semiconductor die 200 by a distance D. The supporter 214 may have a width W1, and the semiconductor die 200 may have a width W2 that is greater than the width W1 of the supporter 214. The supporter 214 may have a height H1, and the semiconductor die 200 may have a height H2 that is equal to or different from the height H1 of the supporter 214. For example, the height H1 of the supporter 214 may be higher or lower than the height H2 of the semiconductor die 200. In addition, the supporter 214 may be in contact with the die-attach surface 701 of the carrier 700. In some embodiments, the supporter 214 is disposed on the carrier 700 before the semiconductor die 200 is disposed on the carrier 700.

In some embodiments, the supporter 214 is formed of semiconductor materials, conductive materials, polymers or a combination thereof. For example, the semiconductor materials may include silicon; germanium; a compound semiconductor including silicon carbide, gallium arsenic, gallium phosphide, indium phosphide, indium arsenide, and/or indium antimonide. For example, the conductive material may include gold (Au), silver (Ag), chromium (Cr), manganese (Mn), iron (Fe), cobalt (Co), nickel (Ni), copper (Cu), aluminum (Al), tungsten (W), titanium (Ti), titanium nitride (TiN), tantalum (Ta), tantalum nitride (TaN), or a combination thereof. For example, the polymers may include epoxy, polyimide, etc. . . .

Figure 3:
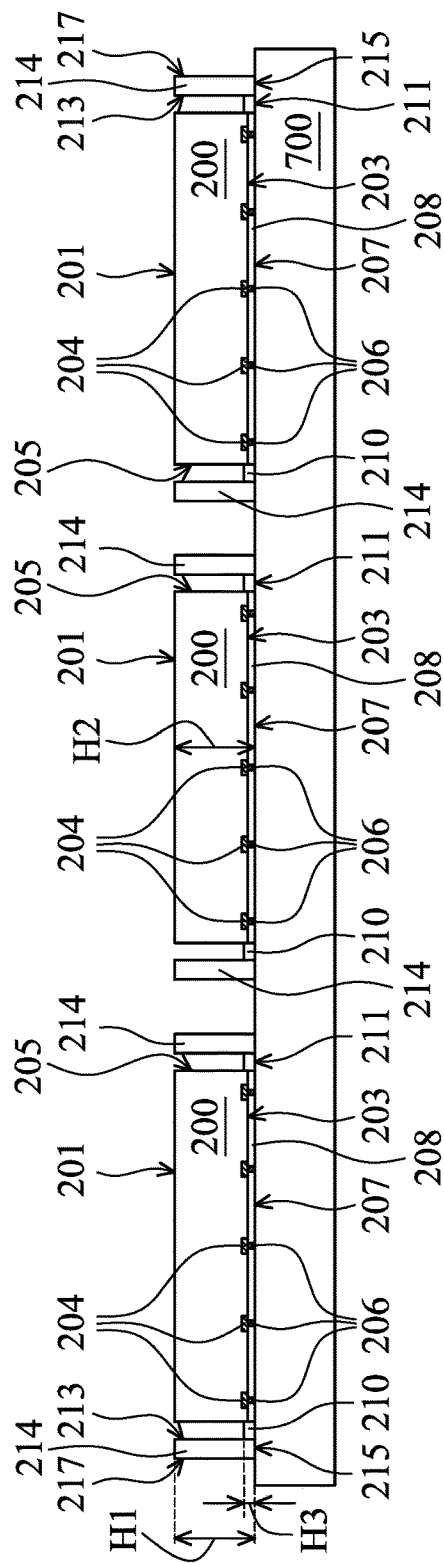

Next, a paste 210 is applied on the carrier 700, as shown in FIG. 3 in accordance with some embodiments. In some embodiments, the paste 210 is positioned between the corresponding semiconductor die 200 and the supporter 214. Therefore, the semiconductor die 200 is surrounded by the paste 210, and the paste 210 is surrounded by the supporter 214. The paste 210 may be in contact with the boundary 205 of the semiconductor die 200 and an inner boundary 213 of the supporter 214. Therefore, the semiconductor die 200 is separated from the supporter 214 by the paste 210. A surface 211 of the paste 210 may be in contact with the die-attach surface 701 of the carrier 700. In addition, the surface 211 of the paste 210 may be leveled with the top surface 207 of the dielectric layer 208 of the semiconductor die 200 and the surface 215 of the supporter 214. In some embodiments, the paste 210 may have a height H3 that is lower than the height H1 of the supporter 214 and the height H2 of the semiconductor die 200. For example, the paste 210 is formed of a glue or epoxy by a spin-on process, or the like. In some embodiments, the paste 210 is optionally formed.

Figure 4:
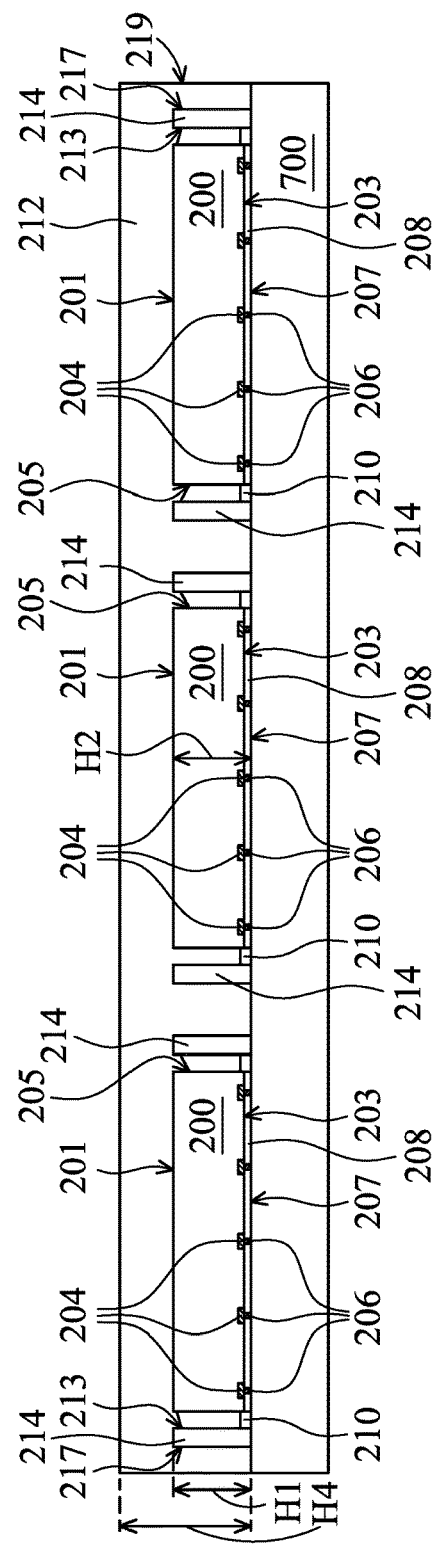

Next, a molding compound 212 may be applied to the carrier 700, as shown in FIG. 4 in accordance with some embodiments. The molding compound 212 may be positioned overlying and covering the semiconductor dies 200, the supporters 214 and the paste 210. The molding compound 212 may also in contact with the back-side surface 201 and the boundary 205 of the semiconductor die 200 and a surface 216, the inner boundary 213 and an outer boundary 217 of the supporter 214. The molding compound 212 may surround the semiconductor dies 200, and fill any gaps between the semiconductor dies 200 and the supporters 214. Therefore, a boundary 219 of the molding compound 212 may surround the outer boundary 217 of the supporter 214. In some embodiments, the supporter 214 is separated from the semiconductor die 200 by the molding compound 212. In some embodiments, the molding compound 212 has a height H4 that is greater than the height H1 of the supporter 214 and the height H2 of the semiconductor die 200.

In some embodiments, the molding compound 212 may be formed of a nonconductive material, such as an epoxy, a resin, a moldable polymer, or the like. The molding compound 212 may be applied while substantially liquid, and then may be cured through a chemical reaction, such as in an epoxy or resin. In some embodiments, the molding compound 212 may be an ultraviolet (UV) or thermally cured polymer applied as a gel or malleable solid capable of being disposed around the semiconductor dies 200 and the supporters 214. Then the molding compound 212 may be cured through a UV or thermal curing process. The molding compound 210 may be cured with a mold.

After the molding compound 212 is applied to the carrier 700, a thinning process (not shown) may be performed to remove a portion of the molding compound 210 from the back-side surfaces 201 of the semiconductor dies 200. Therefore, the height H4 of the molding compound 212 may be reduced to the required thickness.

Afterwards, a separation process is performed to separate the carrier 700 from the front-side surfaces 203 of the semiconductor dies 200. In addition, the carrier 700 is separated from the paste 210, the molding compound 212 and the supporters 214.

In some embodiments, the supporter 214 and the molding compound 212 are formed of different materials. For example, the stiffness of the supporter 214 is greater than the stiffness of the molding compound 212. For example, Young's modulus of the supporter 214 is greater than Young's modulus of the molding compound 212. When the carrier 700 is separated from the semiconductor die 200, the supporter 214, which is positioned surrounding the corresponding semiconductor die 200 and embedded in the molding compound 212, may help to increase the rigidity (stiffness) of a composite structure composed by the semiconductor die 200 and the molding compound 212 covering the semiconductor die 200. Therefore, the supporter 214 may prevent the composite structure from the problems of warpage and defocusing of the photolithography process of the subsequent RDL structure. Therefore, the problems of warpage, delamination, and cracking of the resulting semiconductor package may be eliminated.

Figure 5:
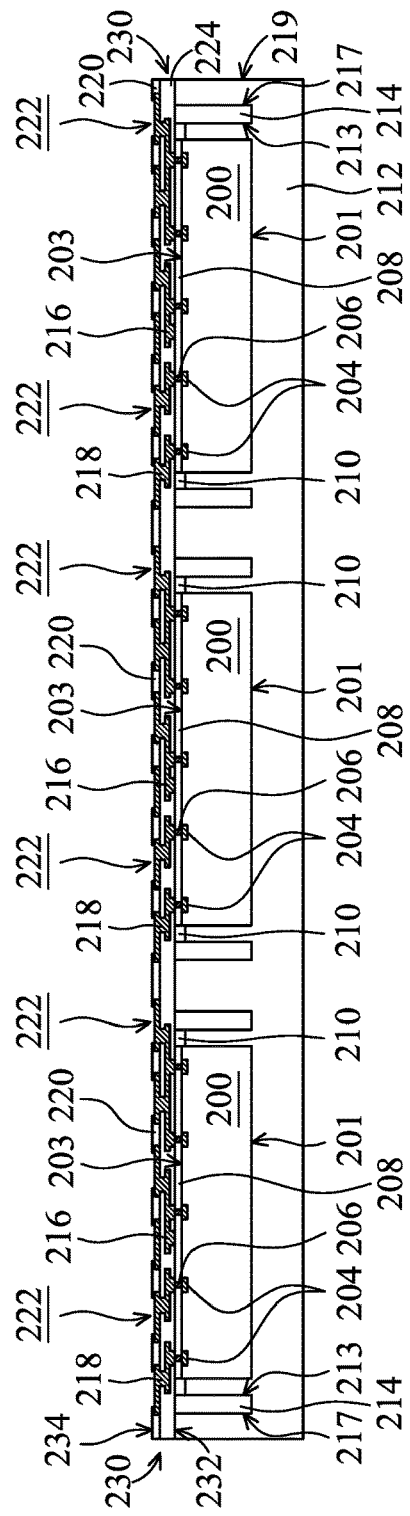

After the carrier 700 is removed from the molding compound 212 and the semiconductor die 200, a redistribution layer (RDL) structure 230 is formed on the molding compound 212, as shown in FIG. 5 in accordance with some embodiments. In some embodiments, the RDL structure 230 may be disposed on the front-side surface 203 of the semiconductor die 200 and electrically coupled to the semiconductor dies 200. For example, the RDL structure 230 has a first surface 232 and a second surface 234 opposite to the first surface 232. The semiconductor dies 200, the paste 210 positioned between the corresponding semiconductor die 200 and the supporter 214, and the molding compound 212 overlying the semiconductor dies 200 may be positioned on the first surface 232 of the RDL structure 230. In addition, the first surface 232 of the RDL structure 230 may be in contact with the molding compound 212, the dielectric layer 208, the paste 210 and the supporters 214. Furthermore, the supporters 214 may be surrounded by the molding compound 212 and the RDL structure 230. In some embodiments, the supporters 214 may be electrically isolated from the semiconductor dies 200 and the RDL structure 230. The paste 210 may be positioned on the first surface 232 of the RDL structure 230 and between the corresponding semiconductor die 200 and the supporter 214. The second surface 234 of the RDL structure 230 may be in contact with subsequent formed conductive structures (e.g. a copper bump or a solder bump structure, a conductive pillar structure, a conductive wire structure, or a conductive paste structure). Therefore, the first surface 232 if the RDL structure 230 may serve as a die-attached surface of the RDL structure 230. The second surface 234 of the RDL structure 230 may serve as a bump-attach surface of the RDL structure 230. Also, the first surface 232 of the RDL structure 230 may be close to the front-side surface 203 of the semiconductor die 200. The second surface 234 of the RDL structure 230 may be positioned away from the semiconductor die 200. In some embodiments, the RDL structure 230 includes conductive traces 216, intermetal dielectric (IMD) layers 224, RDL contact pads 218 and a passivation layer 220. The RDL structure 300 may be formed by at least one deposition process, at least one photolithography process, at least one anisotropic etching process and at least one electroplating process.

In some embodiments, one or more conductive traces 216 are disposed in one or more intermetal dielectric (IMD) layers 224 of the RDL structure 230. The conductive traces 216, which are positioned close to the first surface 232 of the RDL structure 230, are electrically coupled to the die pads 204 of the corresponding semiconductor die 200 through the conductive vias 206 disposed therebetween. Also, the conductive vias 206 and the dielectric layer 208 are in contact with the RDL structure 230. Moreover, the conductive traces 216 are in contact with and electrically connected to corresponding RDL contact pads 218 close to the second surface 234 of the RDL structure 230.

As shown in FIG. 5, the conductive traces 216 of the RDL structure 230 may be designed to fan out from one or more of the die pads 204 of each of the semiconductor dies 200 to provide electrical connections between of each of the semiconductor dies 200 and the corresponding RDL contact pads 218. Therefore, the RDL contact pads 218 may have a larger pitch than the die pads 204 of each of the semiconductor dies 200, which may be suitable for a ball grid array or another package mounting system. For example, the conductive traces 216 electrically connected to one of the semiconductor dies 200 may be electrically isolated from the conductive traces 216 electrically connected another one of the semiconductor dies 200. However, it should be noted that the number of conductive traces 216, the number of 1 MB layers 224 and the number of RDL contact pads 218 shown in FIG. 5 is only an example and is not a limitation to the present invention. In some embodiments, the conductive traces 216 may be formed by a photolithography process and a subsequent electroplating process.

In some embodiments, as shown in FIG. 5, the passivation layer 220 of the RDL structure 230 is formed covering the IMD layers 224, which is close to the second surface 234 of the RDL structure 230 by a deposition process. In some embodiments, the passivation layer 220 serves as a topmost layer of the RDL structure 230. That is to say, a top surface of the passivation layer 220 serves as the second surface 234 of the RDL structure 230.

The passivation layer 220 may be positioned on the RDL contact pads 218, as shown in FIG. 5 in accordance with some embodiments. In some embodiments, the passivation layer 220 is formed by a photolithography process and a subsequent etching process. The photolithography process is performed to form a photoresist pattern (not shown) covering the passivation layer 220. Next, an anisotropic etching process is performed to form openings 222 passing through the passivation layer 220 of the RDL structure 230. In some embodiments, the openings 222 are positioned to correspond with the RDL contact pads 218 of the RDL structure 230. Therefore, portions of the RDL contact pads 218 are respectively exposed to the corresponding openings 222 of the passivation layer 220. In some embodiments, the RDL contact pads 218 are arranged close to the second surface 234 of the RDL structure 230. Afterwards, the photoresist pattern is removed from the passivation layer 220.

For example, the passivation layer 220 may be composed of a material that is the same as or different from that of IMD layers 224 of the RDL structure 230. For example, the passivation layer 220 may be formed of an epoxy, a solder mask, an inorganic material (e.g., silicon nitride ($SiN_x$), silicon oxide ($SiO_x$)), an organic polymer base material, or the like.

Figure 6:
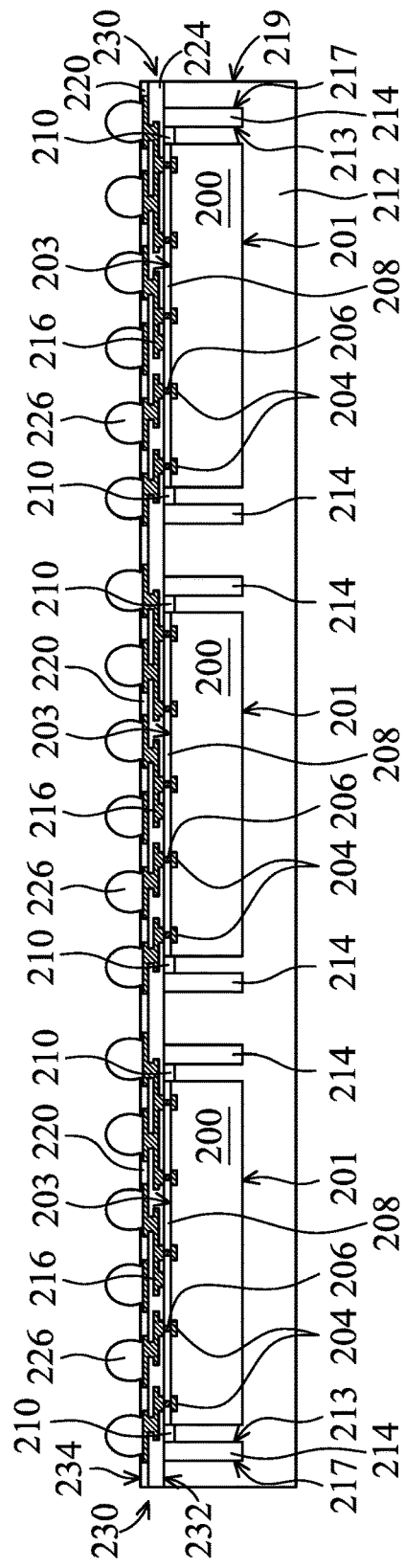

Next, the conductive structures 226 are formed on the RDL structure 230, as shown in FIG. 6 in accordance with some embodiments. The conductive structures 226 may be disposed on the second surface 234 of the RDL structure 230, which is away from the semiconductor dies 200. In some embodiments, the conductive structures 226 are formed passing through the openings 222 of the passivation layer 230 (FIG. 5). Also, the conductive structures 226 may be in contact with and electrically connected to the corresponding RDL contact pads 218, respectively. It should be noted that no UBM (under bump metallurgy) layer is formed between the RDL contact pads 218 and the corresponding conductive structures 226.

In some embodiments, each of the conductive structures 226 may comprise a conductive bump structure such as a copper bump or a solder bump structure, a conductive pillar structure, a conductive wire structure, or a conductive paste structure. When the conductive structures 226 are conductive pillar structures, each of the conductive structures 226 may include a conductive plug and a solder cap over the conductive plug. In addition, the conductive plug may be formed by an electroplating process. The solder cap may be formed by a photolithography process, a solder plating process, a photoresist stripping process and a solder reflow process.

Figure 7:
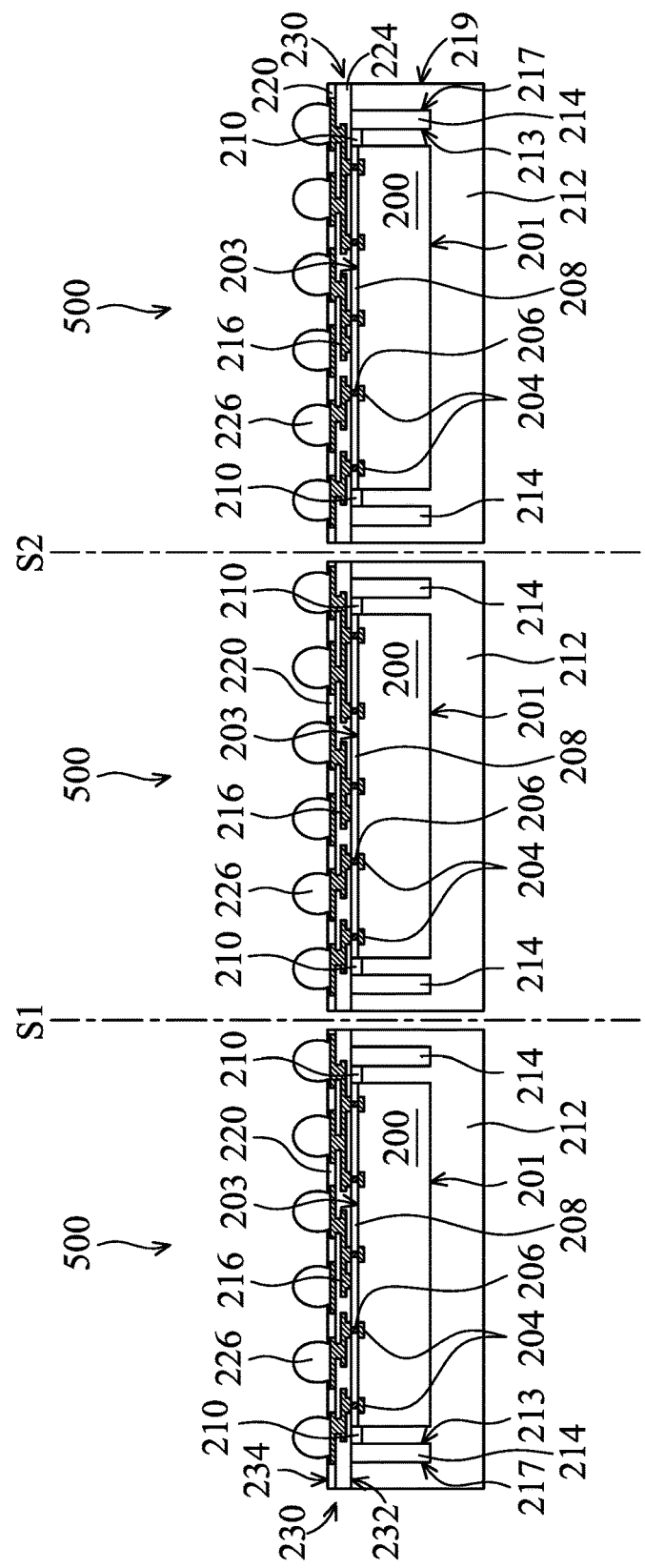

Next, a separation process is performed to cut the RDL structure 230 and the molding compound 212 along scribe lines S1 and S2, as shown in FIG. 7 in accordance with some embodiments. The scribe lines S1 and S2 may be positioned between the semiconductor dies 200. After performing the separation process, individual semiconductor packages 500 are formed. It should be noted that the number of semiconductor packages is not limited to the disclosed embodiment.

In some embodiments, as shown in FIG. 7, each of the semiconductor packages 500 includes the redistribution layer (RDL) structure 230, the semiconductor die 200, the molding compound 212 and the supporter 214. The RDL structure has a first surface 232 and a second surface 234 opposite to the first surface 232. The semiconductor die 200 is disposed on the first surface 232 of the RDL structure 230 and electrically coupled to the RDL structure 230. The molding compound 230 is positioned overlying the semiconductor die 200 and the first surface 232 of the RDL structure 230. The supporter 214 is positioned beside the semiconductor die 200 and in contact with the first surface 232 of the RDL structure 230. In some embodiments, the supporter 214 of the semiconductor package 500 may help to reduce the warpage of the package while the external stress is applied on the semiconductor package 500.

FIGS. 8A-8D are plan views of semiconductor packages 500A, 500B, 500C and 500D in accordance with some embodiments of the disclosure. FIGS. 8A-8D are taken from the front-side surfaces 210 of the semiconductor dies 200 and show shapes of supporters 214A, 214B, 214C and 214D arranged along the boundaries 205 of the semiconductor dies 200 of the semiconductor packages 500A, 500B, 500C and 500D. In FIGS. 8A-8D, the paste 210 and the RDL structure 230 of each of the semiconductor packages 500A, 500B, 500C and 500D are omitted.

In some embodiments, as shown in FIGS. 8A-8D, each of the supporters 214A, 214B, 214C and 214D extends along at least one side of the boundary 205 of the semiconductor die 200. In addition, the supporters 214A, 214B, 214C and 214D may be parallel to the boundary 205 of the corresponding semiconductor dies 200 of the semiconductor packages 500A, 500B, 500C and 500D. The boundaries 219 of the molding compounds 212 of the semiconductor packages 500A, 500B, 500C and 500D may surround outer boundaries 217A, 217B, 217C and 217D of the supporters 214A, 214B, 214C and 214D. Therefore, the supporters 214A, 214B, 214C and 214D may be not exposed (or extruded) from the molding compounds 212 of the semiconductor packages 500A, 500B, 500C and 500D.

In some embodiments, the shape of the supporter 214A of the semiconductor package 500A is ring shape, for example, rectangular ring shape, as shown in FIG. 8A. Therefore, the supporter 214A may extend along and fully surround the boundary 205 of the semiconductor die 200. In some embodiments, the shape of the supporter 214B of the semiconductor package 500B is pound sign (#) shape, as shown in FIG. 8B. Therefore, the supporter 214B may extend along and fully surround the boundary 205 of the semiconductor die 200. In some embodiments, the semiconductor package 500C includes at least two strip-shaped supporters 214C, as shown in FIG. 8C. The supporters 214C may be positioned along opposite sides of the semiconductor die 200, respectively. Therefore, the supporter 214C may extend along and partially surround the boundary 205 of the semiconductor die 200. In some embodiments, the shape of the supporter 214D of the semiconductor package 500D is an L-shape, as shown in FIG. 8D. The supporters 214D may be positioned along adjacent sides of the semiconductor die 200. Therefore, the supporter 214D may extend along and partially surround the boundary 205 of the semiconductor die 200.

Embodiments provide a semiconductor package and a method for fabricating the same, for example, a fan-out wafer-level semiconductor package (FOWLP) a method for fabricating the same. In some embodiments, the semiconductor package includes the supporter extending along with the boundary of the semiconductor die. The supporter may be surrounded by the molding compound and the RDL structure. In addition, the supporter may be electrically isolated from the semiconductor die and the RDL structure. In some embodiments, the supporter is formed of semiconductor materials, conductive materials, polymers or a combination thereof. The stiffness of the supporter may be greater than the stiffness of the molding compound. Therefore, the supporter may help to increase the mechanical strength of the composite structure including the semiconductor die and the molding compound. The supporter may be disposed beside the semiconductor die before applying the molding compound to the carrier. When the carrier is separated from the semiconductor die and the molding compound, the supporter may prevent the composite structure from the problems of warpage and defocusing of the photolithography process of the subsequent RDL structure. In addition, the supporter may help to decrease the usage amount of the molding compound. Therefore, the reliability and quality of the semiconductor package may be improved.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package, comprising:
   a redistribution layer (RDL) structure having a first surface and a second surface opposite to the first surface;
   a semiconductor die disposed on the first surface of the RDL structure and electrically coupled to the RDL structure;
   a molding compound overlying the semiconductor die and the first surface of the RDL structure;
   a supporter beside the semiconductor die and in contact with the first surface of the RDL structure; and
   a paste positioned on the first surface of the RDL structure, wherein the paste is in direct contact with a boundary of the semiconductor die and an inner boundary of the supporter, and the paste connects the semiconductor die and the supporter.

2. The semiconductor package as claimed in claim 1, wherein the supporter is electrically isolated from the semiconductor die and the RDL structure.

3. The semiconductor package as claimed in claim 1, wherein the supporter extends along at least one side of the semiconductor die.

4. The semiconductor package as claimed in claim 1, wherein the supporter surrounds the semiconductor die.

5. The semiconductor package as claimed in claim 1, wherein the molding compound is positioned overlying the supporter.

6. The semiconductor package as claimed in claim 1, wherein the height of the molding compound is greater than the height of the supporter.

7. The semiconductor package as claimed in claim 1, wherein the paste surrounds the semiconductor die, and the supporter surrounds the paste.

8. The semiconductor package as claimed in claim 1, further comprising:
   an RDL contact pad arranged close to the second surface of the RDL structure;
   a passivation layer on the RDL contact pad; and
   a conductive structure passing through the passivation layer and electrically connected to the RDL contact pad.

9. The semiconductor package as claimed in claim 1, wherein the supporter is formed of semiconductor materials, metal materials or a combination thereof.

10. A semiconductor package, comprising:
    a redistribution layer (RDL) structure having a first surface and a second surface opposite to the first surface;
    a semiconductor die disposed on the first surface of the RDL structure and electrically coupled to the RDL structure;
    a molding compound overlying the semiconductor die and the first surface of the RDL structure;
    a supporter extending along a boundary of the semiconductor die, wherein the supporter is electrically isolated from the semiconductor die and the RDL structure; and
    a paste positioned on the first surface of the RDL structure, wherein the paste is in direct contact with the boundary of the semiconductor die and an inner boundary of the supporter, and the paste connects the semiconductor die and the supporter.

11. The semiconductor package as claimed in claim 10, wherein the supporter is separated from the semiconductor die by the molding compound.

12. The semiconductor package as claimed in claim 10, wherein the supporter is ring-shaped, pound sign-shaped, strip-shaped or L-shaped.

13. The semiconductor package as claimed in claim 10, wherein a boundary of the molding compound surrounds a boundary of the supporter.

14. The semiconductor package as claimed in claim 10, wherein the supporter is in contact with the first surface of the RDL structure.

15. The semiconductor package as claimed in claim 10, wherein the supporter and the molding compound are formed of different materials.

16. The semiconductor package as claimed in claim 10, wherein the stiffness of the supporter is greater than the stiffness of the molding compound.

17. The semiconductor package as claimed in claim 10, wherein the supporter is surrounded by the molding compound and the RDL structure.

18. The semiconductor package as claimed in claim 10, wherein the paste surrounds the boundary of the semiconductor die and the inner boundary of the supporter.

19. A method for fabricating a semiconductor package, comprising:
    disposing a semiconductor die on a carrier;
    disposing a supporter on the carrier and beside the semiconductor die;
    applying a molding compound to the carrier, wherein the molding compound covers the semiconductor die and the supporter;
    forming a redistribution layer (RDL) structure on the molding compound and coupled to the semiconductor die; and
    forming conductive structures on the RDL structure;
    applying a paste on the carrier, wherein the paste is in direct contact with a boundary of the semiconductor die and an inner boundary of the supporter, and the paste connects the semiconductor die and the supporter.

20. The method for fabricating a semiconductor package as claimed in claim 19, further comprising:
    removing the carrier from a front-side surface of the semiconductor die before forming the RDL structure.

21. The method for fabricating a semiconductor package as claimed in claim 19,
    wherein applying the paste on the carrier and in direct contact with the boundary of the semiconductor die and the inner boundary of the supporter is performed before applying the molding compound.

22. The method for fabricating a semiconductor package as claimed in claim 19, further comprising:
    forming openings passing through a passivation layer of the RDL structure, wherein the openings are positioned corresponding to RDL contact pads of the RDL structure before forming conductive structures,
    wherein the conductive structures fill the openings and connect the RDL contact pads.

23. The method for fabricating a semiconductor package as claimed in claim 19, wherein the RDL structure is formed on a front-side surface of the semiconductor die.

24. The method for fabricating a semiconductor package as claimed in claim 23, wherein the RDL structure is formed covering the die pads of the semiconductor die.

25. The method for fabricating a semiconductor package as claimed in claim 19, wherein the supporter is disposed on the carrier before the semiconductor die is disposed on the carrier.

* * * * *